United States Patent
Chen et al.

(10) Patent No.: US 6,544,891 B1
(45) Date of Patent: Apr. 8, 2003

(54) METHOD TO ELIMINATE POST-CMP COPPER FLAKE DEFECT

(75) Inventors: Ying-Ho Chen, Taipei (TW); Wen-Chih Chiou, Miaoli (TW); Tsu Shih, Hsin-Chu (TW); Syun-Ming Jang, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/945,435

(22) Filed: Sep. 4, 2001

(51) Int. Cl.$^7$ ................................................ H01L 21/44
(52) U.S. Cl. ...................... 438/687; 438/633; 438/637; 438/672; 438/675; 438/692
(58) Field of Search ........................ 438/687, 627–628, 438/633–634, 637–640, 642–644, 612–673, 675, 678, 691–693

(56) References Cited

U.S. PATENT DOCUMENTS

| | | | |
|---|---|---|---|
| 5,674,787 A | * 10/1997 | Zhao et al. ................. 438/627 |
| 5,759,906 A | 6/1998 | Lou ............................ 438/623 |
| 6,010,962 A | 1/2000 | Liu et al. .................... 438/687 |
| 6,110,819 A | * 8/2000 | Colgan et al. .............. 438/625 |
| 6,133,144 A | 10/2000 | Tsai et al. ................... 438/634 |
| 6,136,680 A | 10/2000 | Lai et al. .................... 438/597 |
| 6,171,960 B1 | * 1/2001 | Lee ............................ 438/629 |
| 6,188,120 B1 | * 2/2001 | Andricacos et al. ........ 257/306 |
| 6,197,704 B1 | * 3/2001 | Endo et al. ................. 438/780 |
| 6,249,055 B1 | * 6/2001 | Dublin ........................ 257/751 |
| 6,261,953 B1 | * 7/2001 | Uozumi .................... 427/419.2 |
| 6,261,954 B1 | * 7/2001 | Ho et al. .................... 438/633 |
| 6,287,954 B1 | * 9/2001 | Ashley et al. .............. 438/618 |

* cited by examiner

Primary Examiner—Tuan H. Nguyen
Assistant Examiner—Thanh Nguyen
(74) Attorney, Agent, or Firm—George O. Saile; Stephen B. Ackerman; Rosemary L. S. Pike

(57) ABSTRACT

A method of copper metallization wherein copper flaking and metal bridging problems are eliminated by an annealing process is described. A first metal line is provided on an insulating layer overlying a semiconductor substrate. A dielectric stop layer is deposited overlying the first metal line. A dielectric layer is deposited overlying the dielectric stop layer. An opening is etched through the dielectric layer and the dielectric stop layer to the first metal line. A barrier metal layer is deposited over the surface of the dielectric layer and within the opening. A copper layer is deposited over the surface of the barrier metal layer. The copper layer and barrier metal layer not within the opening are polished away wherein after a time period, copper flakes form on the surface of the copper and dielectric layers. The copper layer and the dielectric layer are alloyed whereby the copper layer is stabilized and the copper flakes are removed to complete copper damascene metallization in the fabrication of an integrated circuit.

32 Claims, 3 Drawing Sheets

METHOD TO ELIMINATE POST-CMP COPPER FLAKE DEFECT

BACKGROUND OF THE INVENTION (1) Field of the Invention

The invention relates to a method of metallization in the fabrication of integrated circuits, and more particularly, to a method of eliminating defects caused by copper flaking after CMP in the manufacture of integrated circuits.

(2) Description of the Prior Art

In a common application for integrated circuit fabrication, a contact/via opening is etched through an insulating layer to an underlying conductive area to which electrical contact is to be made. A barrier layer is formed within the contact/via opening. A conducting layer material is deposited within the contact/via opening. Because of its lower bulk resistivity, Copper (Cu) metallization is the future technology for feature sizes in the deep sub-half-micron regime. Cu has been used successfully as an interconnection line. Low dielectric constant materials are preferred as the insulating layer in the copper interconnect process in order to improve RC time delay. After the copper is deposited within the opening, it is typically polished back by chemical mechanical polishing (CMP) to leave the copper only within the opening. After this CMP process, flakes of copper form on the surface of the copper and dielectric layers after a Q-time of more than 12 hours. If the copper flakes remain, metal bridging will be induced undesirably. In order to remove the copper flakes, a wafer rework by CMP re-polish is performed. However, this re-polish will induce copper loss and degrade resistance target and uniformity. That is, resistance will become higher and uniformity will degrade because of the re-polish process. It is desired to find a method to eliminate the problems of copper flaking and metal bridging without copper loss while maintaining resistance target and uniformity.

U.S. Pat. No. 6,136,680 to Lai et al teaches a method of forming copper damascene interconnections through a fluorinated silicate glass (FSG) layer. After CMP, the wafer is annealed and subjected to a plasma treatment in order to remove Si-OH bonds and copper oxides on the surface of the FSG layer. U.S. Pat. No. 6,133,144 to Tsai et al discloses a dual damascene process. U.S. Pat. No. 6,010,962 to Liu et al describes a copper process. U.S. Pat. No. 5,759,906 to Lou shows an interconnect process.

SUMMARY OF THE INVENTION

A principal object of the present invention is to provide an effective and very manufacturable method of copper metallization in the fabrication of integrated circuit devices.

Another object of the invention is to provide a method of copper metallization wherein copper flaking and metal bridging problems are eliminated.

A further object of the invention is to provide a method of copper metallization wherein stability of the copper film is improved.

Yet another object of the invention is to provide a method of copper metallization wherein wafers with copper flake defects can be re-worked without copper loss.

Yet another object of the invention is to provide a method of copper metallization wherein copper flaking and metal bridging problems are eliminated by an annealing process.

In accordance with the objects of this invention a method of copper metallization wherein copper flaking and metal bridging problems are eliminated by an annealing process is achieved. A first metal line is provided on an insulating layer overlying a semiconductor substrate. A dielectric stop layer is deposited overlying the first metal line. A dielectric layer is deposited overlying the dielectric stop layer. An opening is etched through the dielectric layer and the dielectric stop layer to the first metal line. A barrier metal layer is deposited over the surface of the dielectric layer and within the opening. A copper layer is deposited over the surface of the barrier metal layer. The copper layer and barrier metal layer not within the opening are polished away wherein copper flakes form on the surface of the copper and dielectric layers after a time period. The copper layer and the dielectric layer are alloyed whereby the copper layer is stabilized and the copper flakes are removed to complete copper damascene metallization in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

The present invention provides a method for improving the stability of a copper film. This will eliminate copper flaking and metal bridging problems.

Figure 1:
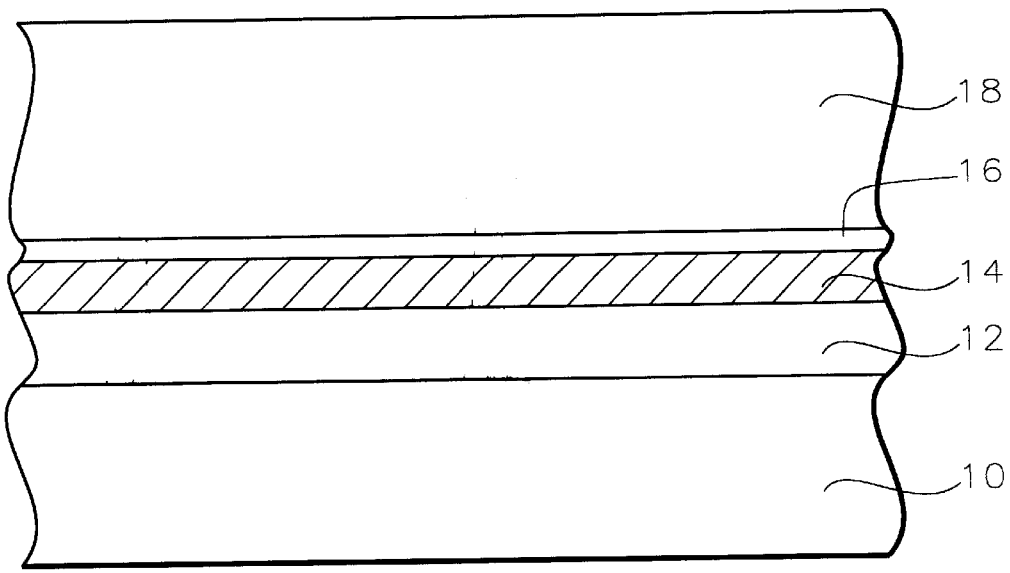
FIGS. 1 through 5 schematically illustrate in cross-sectional representation a preferred embodiment of the present invention.

Referring now more particularly to FIG. 1, there is illustrated a portion of a partially completed integrated circuit device. There is shown a semiconductor substrate 10, preferably composed of monocrystalline silicon. Semiconductor devices structures, such as gate electrodes and source and drain regions, not shown, are formed in and on the semiconductor substrate. These semiconductor device structures are covered with an insulating layer such as silicon oxide. The semiconductor device structures and insulating layer thereover are represented by layer 12 in FIG. 1.

A first metal line 14 is formed over the insulating layer 12 by conventional means. For example, this may be a copper interconnection line, or other materials such as tungsten or aluminum or AlCu. The metal line 14 will contact some of the underlying semiconductor device structures through openings in the insulating layer in other areas of the substrate, not shown.

A dielectric stop layer 16 is deposited over the metal line 14 to a thickness of between about 300 and 1000 Angstroms, and preferably 300 to 800 Angstroms. This stop layer may comprise silicon nitride, silicon oxynitride, or silicon carbide.

An insulating layer 18 is deposited over the dielectric stop layer 16 to a thickness of between about 2000 to 10,000 Angstroms, and preferably 3000 to 5000 Angstroms, and preferably planarized. Preferably, the insulating layer comprises a low dielectric constant material such as fluorinated silicate glass (FSG), hydrogen silsesquioxane (HSQ), methylsilsesquioxane (MSQ), SILK, FLARE, or Black Diamond, and so on. If a dual damascene process is to be used, a second stop layer and a second low dielectric constant insulating layer are deposited over the first insulating layer 18, not shown. It is to be understood that a dual damascene process, although not illustrated, could also be used according to the process of the invention.

Figure 2:
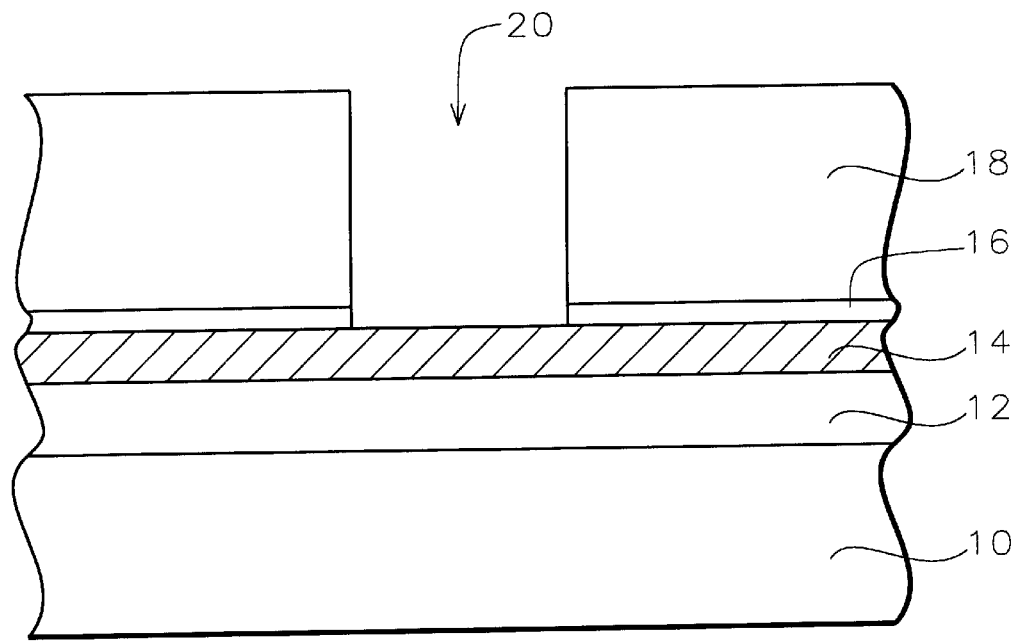

A damascene opening 20, illustrated in FIG. 2, is etched through the insulating layer 18 using a typical process. If a dual-damascene process is to be used, the damascene opening 20 can be formed by any of the conventional processes, including trench-first, via-first, and self-aligned processes.

Figure 3:
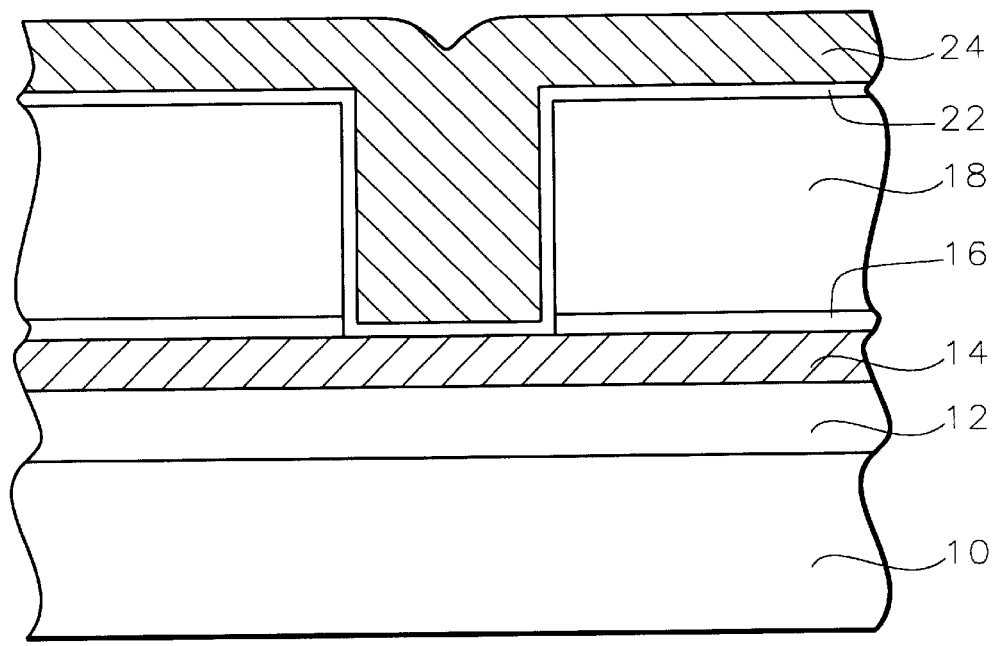

The dielectric stop layer 16 within the damascene opening 20 is etched away. The damascene opening is cleaned as is conventional in the art. A barrier metal layer 22 is deposited within the opening, as illustrated in FIG. 3. Typically, this barrier metal layer 22 will comprise a copper diffusion barrier material such as tantalum, tantalum nitride, or a copper seed layer, having a thickness of between about 1000 and 2500 Angstroms, and preferably 50 to 500 Angstroms.

Now, a copper layer 24 is to be deposited within the opening. The copper layer may be deposited by physical or chemical vapor deposition, using electroless plating, or electrochemical plating, for example.

Figure 4:
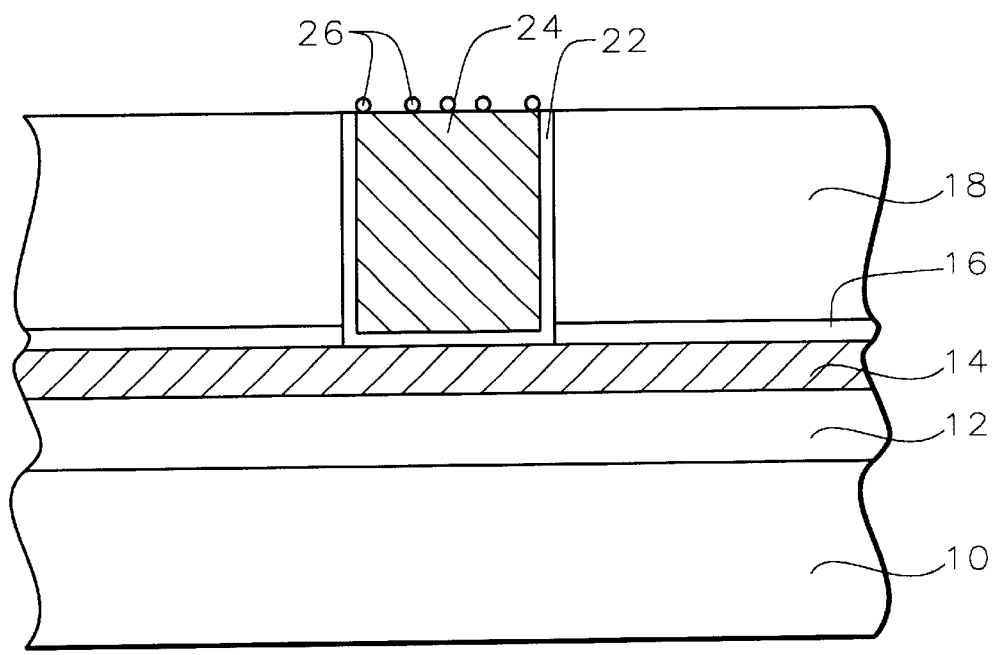

Referring now to FIG. 4, the copper layer 24 and the barrier layer 22 are polished using chemical mechanical polishing (CMP) to remove the layers except within the opening, as shown. After a post-CMP Q-time of more than about 12 hours, copper flakes 26 are formed on the surface of the copper layer 24 and dielectric layer 18. If these flakes remain, they can cause metal bridging, resulting in improper operation of the integrated circuit.

Typically, these copper flakes have been removed by a re-polish using CMP. However, this can result in loss of the copper in the interconnection line 24, causing loss of uniformity and departure from the target resistance.

The process of the present invention provides for a rework process that removes the copper flakes without causing loss of copper or any change in the resistance values. The wafer is alloyed such as by furnace annealing at a temperature of between about 200 and 400° C. for a duration of 10 minutes to two hours, and preferably 10 to 30 minutes in a $N_2/H_2$ ambient. As alternatives to a furnace anneal, annealing can be performed in a hot plate, oven, or rapid thermal annealing (RTA) or rapid thermal process (RTP) tools. The annealing process must use a low temperature of less than about 400° C. A rapid thermal anneal may be performed at between about 300 and 400° C. for 0.5 to 2 minutes.

Figure 5:
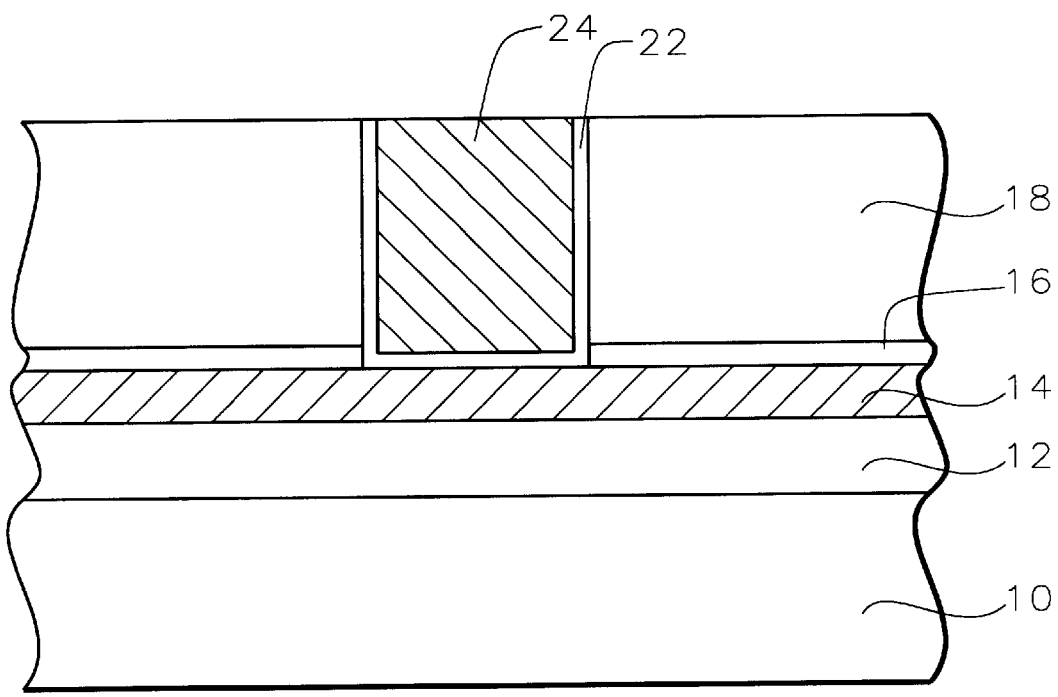

The alloying process removes the copper flakes, as shown in FIG. 5. In addition, the alloying process prevents copper hillocks, stabilizes the copper grains, and improves copper morphology. Improvement of copper stability reduces hillocks. This is important because copper hillocks degrade the film adhesion between copper and the intermetal dielectric layer.

The alloying process of the invention can be performed before the CMP process; for example, after FIG. 3. In this case, the copper film variation is reduced leading to stabilization of the copper film 24 and improved CMP performance. Alloying post-CMP to remove the copper flakes must still be performed.

The process of the invention has been tried experimentally. Copper flakes were seen on the low dielectric constant dielectric layer after CMP. The wafers were reworked using CMP re-polish, DNS clean, or the alloying process of the invention. Results showed that both the CMP re-polish and the alloying process removed the copper flakes. The DNS clean process was not effective in removing the flakes. However, while the CMP re-polish caused loss of copper from the interconnect line 24, the alloying process of the present invention did not cause copper loss. In the process of the invention, copper flakes and metal bridging were eliminated while maintaining original resistance target values and uniformity without copper loss.

The process of the present invention provides a method for forming copper interconnections while eliminating the problems of copper flakes and metal bridging without copper loss while maintaining resistance target values and uniformity. The alloying process of the invention can be used safely with low dielectric constant materials and etch stop materials including silicon carbide. The alloying process of the invention results in stable copper grains and improved copper morphology while preventing copper hillocks.

While the invention has been particularly shown and described with reference to the preferred embodiments thereof, it will be understood by those skilled in the art that various changes in form and details may be made without departing from the spirit and scope of the invention.

What is claimed is:

1. A method of forming copper damascene metallization in the fabrication of integrated circuits comprising:
    providing a dielectric layer overlying a substrate;
    etching an opening through said dielectric layer to said substrate;
    filling said opening with a copper layer;
    polishing away said copper layer not within said opening; and
    thereafter alloying said copper layer and said dielectric layer in hydrogen and nitrogen gas whereby said copper layer is stabilized to complete said copper damascene metallization in said fabrication of said integrated circuit.

2. The method according to claim 1 further comprising forming semiconductor device structures including gate electrodes and source and drain regions in and on said substrate and forming a first metallization layer wherein said copper layer contacts said first metallization layer.

3. The method according to claim 2 further comprising a depositing a dielectric stop layer overlying said first metallization layer wherein said dielectric stop layer is chosen from the group consisting of: silicon nitride, silicon oxynitride, and silicon carbide and has a thickness of between about 300 and 800 Angstroms.

4. The method according to claim 1 wherein said dielectric layer is chosen from the group containing: fluorinated silicate glass (FSG), hydrogen silsesquioxane (HSQ), methylsilsesquioxane (MSQ), SILK, FLARE, and Black Diamond and has a thickness of between about 3000 and 5000 Angstroms.

5. The method according to claim 1 further comprising depositing a barrier metal layer within said opening underlying said copper layer wherein said barrier metal layer is chosen from the group containing: tantalum, tantalum nitride, and a copper seed layer and has a thickness of between about 1000 and 2500 Angstroms.

6. The method according to claim 1 wherein said copper layer is deposited by forming a copper seed layer and electoplating to form said copper layer.

7. The method according to claim 1 wherein said step of polishing away said copper layer comprises chemical mechanical polishing.

8. The method according to claim 1 wherein said step of alloying comprises a furnace anneal at between about 300 and 400 degrees for 0.5 to 2 hours.

9. The method according to claim 1 wherein said step of alloying comprises annealing on a hot plate at between about 300 and 400 degrees for 0.5 to 1 hour.

10. The method according to claim 1 wherein said step of alloying comprises annealing in an oven at between about 300 and 400 degrees for 0.5 to 2 hours.

11. The method according to claim 1 wherein said step of alloying comprises a rapid thermal anneal at between about 300 and 400 degrees for 0.5 to 2 minutes.

12. The method according to claim 1 wherein after said step of polishing said copper layer, copper flakes are formed on said dielectric layer and on said copper layer and wherein said step of alloying removes said copper flakes.

13. A method of forming copper damascene metallization in the fabrication of integrated circuits comprising:

provinding a first metal line on an insulating layer overlying a substrate;

depositing a dielectric stop layer overlying said first metal line;

depositing a dielectric layer overlying said dielectric stop layer;

etching an opening through said dielectric layer and said dielectric stop layer to said first metal line;

depositing a barrier metal layer over the surface of said dielectric layer and within said opening;

depositing a copper layer over the surface of said barrier metal layer;

polishing away said copper layer and said barrier metal layer not within said opening wherein after a time period, copper flakes form on a surface of said dielectric layer; and thereafter alloying said copper layer and said dielectric layer in hydrogen and nitrogen gas whereby said copper layer is stabilized and whereby said copper flakes are removed to complete said copper damascene metallization in said fabrication of said integrated circuit.

14. The method according to claim 13 further comprising forming semiconductor device structures including gate electrodes and source and drain regions underlying said insulating layer.

15. The method according to claim 13 wherein said dielectric stop layer is chosen from the group consisting of: silicon nitride, silicon oxynitride, and silicon carbide and has a thickness of between about 300 and 800 Angstroms.

16. The method according to claim 13 wherein said dielectric layer is chosen from the group containing: fluorinated silicate glass (FSG), hydrogen silsesquioxane (HSQ), methylsilsesquioxane (MSQ), SILK, FLARE, and Black Diamond and has a thickness of between about 3000 and 5000 Angstroms.

17. The method according to claim 13 wherein said barrier metal layer is chosen from the group containing: tantalum, tantalum nitride, and a copper seed layer and has a thickness of between about 1000 and 2500 Angstroms.

18. The method according to claim 13 wherein said copper layer is deposited by forming a copper seed layer and electoplating to form said copper layer.

19. The method according to claim 13 wherein said step of polishing away said copper layer and said barrier metal layer comprises chemical mechanical polishing.

20. The method according to claim 13 wherein said step of alloying comprises a furnace anneal at between about 300 and 400 degrees for 0.5 to 2 hours.

21. The method according to claim 13 wherein said step of alloying comprises annealing on a hot plate at between about 300 and 400 degrees for 0.5 to 1 hour.

22. The method according to claim 13 wherein said step of alloying comprises annealing in an oven at between about 300 and 400 degrees for 0.5 to 2 hours.

23. The method according to claim 13 wherein said step of alloying comprises a rapid thermal anneal at between about 300 and 400 degrees for 0.5 to 2 minutes.

24. A method of forming copper damascene metallization in the fabrication of integrated circuits comprising:

providing a first metal line on an insulating layer overlying a substrate;

depositing a dielectric stop layer overlying said first metal line;

depositing a low dielectric constant dielectric layer overlying said dielectric stop layer;

etching an opening through said low dielectric constant dielectric layer and said dielectric stop layer to said first metal line;

depositing a barrier metal layer over the surface of said low dielectric constant dielectric layer and within said opening;

depositing a copper layer over the surface of said barrier metal layer;

chemical mechanical polishing away said copper layer and said barrier metal layer not within said opening wherein after a time period of more than 12 hours, copper flakes form on a surface of said low dielectric constant dielectric layer and said copper layer; and thereafter alloying said copper layer and said low dielectric constant dielectric layer in hydrogen and nitrogen gas at a temperature of less than 400° C. whereby said copper layer is stabilized and whereby said copper flakes are removed to complete said copper damascene metallization in said fabrication of said integrated circuit.

25. The method according to claim 24 further comprising forming semiconductor device structures including gate electrodes and source and drain regions underlying said insulting layer.

26. The method according to claim 24 wherein said dielectric stop layer is chosen from the group consisting of: silicon nitride, silicon oxynitride, and silicon carbide and has a thickness of between about 300 and 800 Angstroms.

27. The method according to claim 24 wherein said low dielectric constant dielectric layer is chosen from the group containing: fluorinated silicate glass (FSG), hydrogen silsesquioxane (HSQ), methylsilsesquioxane (MSQ), SILK, FLARE, and Black Diamond and has a thickness of between about 3000 and 5000 Angstroms.

28. The method according to claim 24 wherein said barrier metal layer is chosen from the group containing: tantalum, tantalum nitride, and a copper seed layer and has a thickness of between about 1000 and 2500 Angstroms.

29. The method according to claim 24 wherein said step of alloying comprises a furnace anneal at between about 300 and 400 degrees for 0.5 to 2 hours.

30. The method according to claim 24 wherein said step of alloying comprises annealing on a hot plate at between about 300 and 400 degrees for 0.5 to 1 hour.

31. The method according to claim 24 wherein said step of alloying comprises annealing in an oven at between about 300 and 400 degrees for 0.5 to 2 hours.

32. The method according to claim 24 wherein said step of alloying comprises a rapid thermal anneal at between about 300 and 400 degrees for 0.5 to 2 minutes.

* * * * *